United States Patent [19]

Adlon et al.

[11] Patent Number: 4,928,066
[45] Date of Patent: May 22, 1990

[54] CONTINUITY COUPLING IN A HARNESS MAKING MACHINE

[75] Inventors: Daniel T. Adlon, Harrisburg; Richard V. Spong, Etters; Stephen M. Cerquone; David E. Bickford, both of Harrisburg, all of Pa.

[73] Assignee: AMP Incorporated, Harrisburg, Pa.

[21] Appl. No.: 335,019

[22] Filed: Apr. 7, 1989

[51] Int. Cl.$^5$ ............................................. G01R 31/02
[52] U.S. Cl. ..................................... 324/539; 324/66; 379/26
[58] Field of Search .............. 324/539, 540, 541, 542, 324/66; 29/593, 705; 379/26

[56] References Cited

U.S. PATENT DOCUMENTS

| | | | |
|---|---|---|---|
| 4,034,472 | 7/1977 | Cover et al. | 29/749 |
| 4,038,501 | 7/1977 | Volk | 324/66 |
| 4,160,947 | 7/1979 | Tanno et al. | 324/539 |
| 4,177,097 | 12/1979 | Hudson, Jr. et al. | 324/541 X |
| 4,238,874 | 12/1980 | Chandler et al. | 29/33 M |
| 4,470,181 | 9/1984 | Sergeant | 29/33 M |
| 4,584,766 | 4/1986 | Ogawa et al. | 324/66 X |
| 4,734,651 | 3/1988 | Keller et al. | 324/538 |
| 4,785,240 | 11/1988 | Newell et al. | 324/207 |
| 4,794,339 | 12/1988 | LeNir et al. | 324/540 |

Primary Examiner—Reinhard J. Eisenzopf
Assistant Examiner—Robert W. Mueller

[57] ABSTRACT

An apparatus is disclosed for automatically making and testing electrical cable assemblies. A novel coupling is provided between the bulk cable contained on a large reel and the logic circuitry of the automated machine so that individual wires within the cable can be identified, inserted into a desired terminal of a connector, and tested. The coupling utilizes a slip ring assembly to communicate with the individual wires of the cable through a connector that has been previously terminated on a pigtail extending from the central core of the reel.

9 Claims, 2 Drawing Sheets

CONTINUITY COUPLING IN A HARNESS MAKING MACHINE

The present invention relates to an automated apparatus for making an electrical cable assembly of the type having a plurality of discrete insulated wires within a common insulating jacket wherein each end of the wires terminates in a connector.

BACKGROUND OF THE INVENTION

A commonly known type of machine for making electrical cable assemblies is shown in U.S. Pat. No. 4,238,874 which issued Dec. 16, 1980 to Chandler et al. and which is hereby incorporated by reference as if set forth verbatim herein. The machine of Chandler et al. includes a connector holder, a pair of opposed wire inserting mechanisms, one on each side of the connector, a clamp for holding a jacketed cable directly above the connector, and means for positioning the terminals of the connector in alignment with the wire inserters. The operator will select the first pair of wires to be terminated, place the wires on opposite sides of the connector and in alignment with the first set of terminals which automatically trips a limit switch which activates the pair of wire inserters. The wires are inserted into the terminals and the connector is advanced to the next terminal position ready for the next pair of wires. This procedure continues until all of the cable pairs are terminated in the connector. Another similar machine is disclosed in U.S. Pat. No. 4,034,472 which issued July 12, 1977 to Cover et al. Both Chandler et al. and Cover et al. require that an operator select each pair of wires and present them to the machine in the proper order for insertion.

An apparatus for automatically selecting a single wire from a stack of wires and positioning the wire in alignment with its respective terminal for insertion is disclosed in U.S. Pat. No. 4,470,181 which issued Sept. 11, 1984 to Sergeant, and which is hereby incorporated by reference as if set forth verbatim herein. Sergeant discloses a pair of rollers for holding a plurality of discrete wires in a planar vertical stack and an escapement mechanism for taking the bottom-most wire from the stack. The plurality of wires emanate from one end of a jacketed cable which is clamped in the machine. The wires at the other end of the cable are terminated in a connector. When a wire is taken from the stack, it is moved into a contact which pierces the insulation and makes electrical contact with the conductor of the wire. A signal, which appears on the contact is then impressed on the conductor and appears on the respective terminal of the connector at the other end of the cable, which is continuously monitored. The terminal upon which this signal appears is then translated into a corresponding terminal position at the insertion station which appropriately positions the connector for insertion of the selected wire. This apparatus, when combined with the machine of Chandler et al., resulted in an automated machine for making electrical cable assemblies.

In a production environment, it would be desirable to accept cable from a large reel. When a specific wire code to connector terminal is desired, however, each first connector would have to be terminated manually. The present invention addresses this problem by providing a means for electrically coupling the wires of the cable while on the reel to the automated machine. This is done in such a way that, as cable assemblies are finished, additional cable may be drawn off the reel without disturbing the electrical coupling. Additionally, different reels having various types and kinds of cable may be easily and quickly coupled to the machine to meet production requirements.

DESCRIPTION OF THE PREFERRED EMBODIMENT

Figure 1:
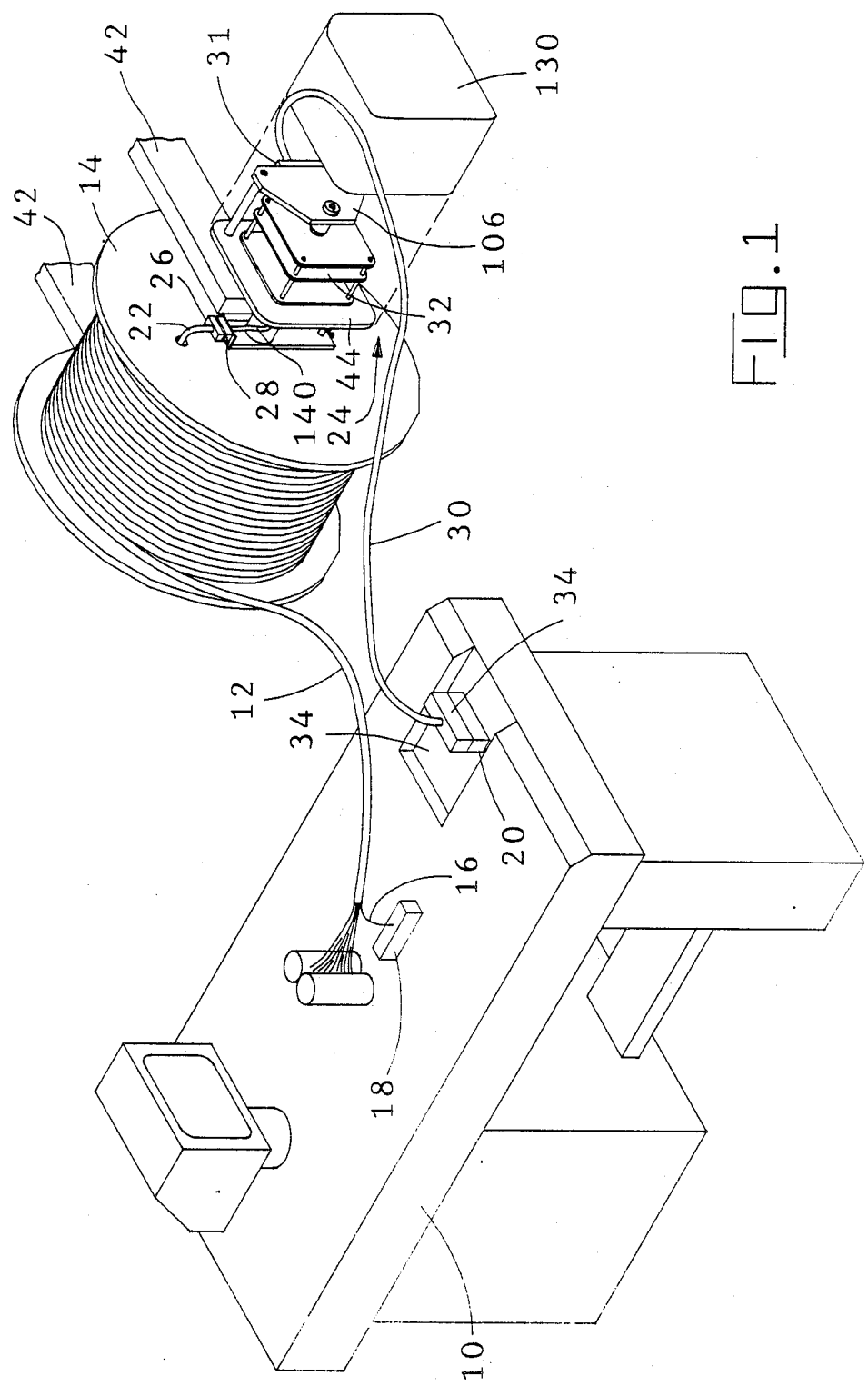
FIG. 1 is a schematic representation of an apparatus for making cable assemblies in accordance with the teachings of the present invention.

There is shown in FIG. 1 an automated machine 10 for processing electrical cable 12 contained on a rotatable reel 14. The machine 10 may be any cable processing machine that automatically identifies a wire 16 of the cable and terminates that wire in a desired terminal position of a connector 18. Such a machine, for example, is the CHAMPOMATOR ® A Terminating Machine shown in Catalog 89-869 and manufactured by AMP Incorporated of Harrisburg, Pa. 17105. For more details of the structure and operation of such a machine, the reader is directed to the two aforementioned U.S. Patents of Chandler et al. and Sergeant.

As will be understood by the skilled art worker, when making a cable assembly having a connector terminated at each end of the cable, the first end is terminated in one of two ways. Either the first end is terminated randomly by the machine 10, or if wire identification, such as color code, must be related to corresponding terminals of the connector, the first end is terminated manually or by other means. The connector which was so terminated is then mated with a connector 20 which is coupled to a plurality of electrodes, not shown, within the machine 10. The other end of the cable is then terminated to a second connector 18 wherein the machine 10 identifies each individual wire, associates it with one of the plurality of electrodes, determines the corresponding terminal position of the connector 18, and inserts the wire into that terminal. In the present case, however, the cable 12 is drawn off a reel 14 which has a pigtail 22 protruding through an opening in the side of the reel. The wires of this pigtail are electrically coupled to the plurality of electrodes of the machine 10 by a coupling means which includes a rotational coupling unit 24, a pair of mating connector halves 26 and 28, a cable assembly 30 having a connector half 31 at one end and a connector half 34 at the other end which mates with the connector half 20. While there may be a one to one correspondence between the wires of the cable assembly 30 and those of the cable 12, there need not be. In the preferred embodiment, there are fewer wires in the cable assembly 30 necessitating a multiplexing circuit, which is embodied on a substrate 32 shown in FIG. 2, and in a substrate 34 which supports the connector half 20 on the machine 10. In the present example the cable 30 contains four wires and the cable 12 contains 50 wires.

Figure 2:
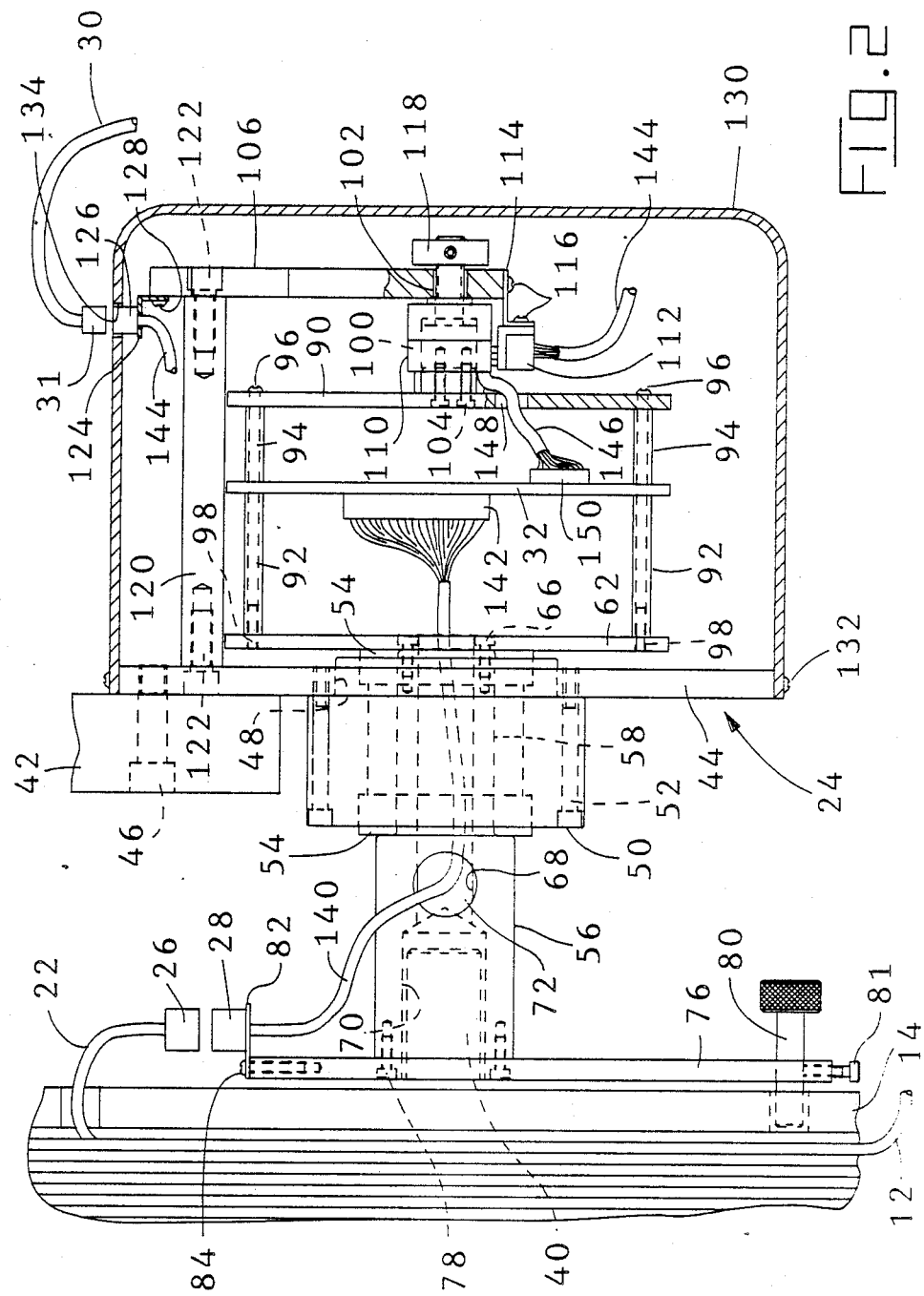
FIG. 2 is a side view of the rotational coupling it shown in FIG. 1.

The reel 14 is rotationally supported on an axle 40, see FIG. 2, which in turn is supported by the frame 42 and portions of the rotational coupling unit 24 as will now be described. A base plate 44 is rigidly attached to the frame 42 by means of screw fasteners 46. The base plate 44, which in the present example is rectangular, has a central bore 48 which receives an undercut diameter of a hub 50. The hub 50 is rigidly attached to the base plate 44 by means of the screw fasteners 52. A pair of opposed tapered roller bearings 54 are disposed in bores in the hub 50 as shown in FIG. 2. A drive axle 56 has a reduced diameter portion 58 which snugly engages the inner races of the two roller bearings 54. A first rotating plate 62 is held securely against the end of the portion 58 by means of the screw fasteners 66. A bore 68 is disposed axially through the drive axle 56 and plate 62 and has an enlarged bore diameter 70 at the end opposite the end having the diameter 58. This enlarged bore diameter loosely receives an end of the axle 40 as seen in FIG. 2. An opening 72 is formed through the side of the drive axle 56 so that it intersects with the bore 68 for a purpose that will be explained below. A drive dog plate 76 is attached to the end of the drive axle 56 that is opposite the end having the plate 62, by means of the screw fasteners 78. A drive pin 80 is loosely fit into an opening in an end of the drive dog plate 76 and projects into an opening of the reel 14. The drive pin 80 is secured in place by a thumb screw 81 which engages a threaded hole in the plate 76. Thus, when the reel 14 is turned about the axle 40, this rotational motion is imparted to the drive axle 56 through the drive pin 80. A bracket 82 is attached to the other end of the drive dog plate 76 by means of the screw fasteners 84. The connector half 28 is secured to this bracket by any suitable means.

A second rotating plate 90 is attached to the first rotating plate 62 by means of the spacers 92 and 94 and the screws 96 which engage threaded holes 98 in the first plate 62. Note that the substrate 32 is sandwiched between the spacers 92 and 94 and includes clearance holes for the passage of the screws 96. A hub 100 having a reduced diameter 102 projecting axially along the center of rotation of the drive axle 56 is attached to the second plate 90 by means of the screw fasteners 104. The reduced diameter 102 engages a bore in a support plate 106, which may contain a suitable bearing. A slip ring rotor 110 having four slip rings is press fit onto the hub 100 as shown in FIG. 2. A mating slip ring stator 112 is attached to the end of the support plate 106 by means of a bracket 114 and associated screw fasteners 116 as shown. The stator 112 is positioned so that the stator contacts properly engage the four slip rings of the rotor 110 in accordance with the manufacturer's requirements. In the present example a slip ring assembly Model No. 1401, manufactured by Fabricast, Inc. of 2517 Seaman Avenue, P.O. Box 3176, South El Monte, Calif. 91733 was used. Any similar slip ring assembly may be used. A collar 118 is secured to the end of the reduced diameter 102 by a setscrew to control end play of the rotating members. The support plate 106 is rigidly attached to the base plate 44 by two posts 120 and the screw fasteners 122. A bracket 124 having a connector half 126 secured thereto is attached to an end of the support plate 106 opposite the end having the bracket 114 by means of the screw fasteners 128. The connector half 126 mates with the connector half 31. A cover 130 is provided to completely cover the rotating parts. The cover snugly engages the periphery of the base plate 44 and is held in place by the screws 132. An opening 134 is provided in the cover in alignment with the connector half 126 so that the connector may be mated with the connector half 31 without removing the cover.

A cable 140 having at least as many wires as does the cable 12 is terminated at one end to the terminals of the connector half 28, the other end being routed through the opening 72 and bore 68 and into the area adjacent the substrate 32. The other end of the cable 140 is terminated to the terminals of the connector 142, which engage circuitry on the substrate 32. Another cable 144 having four wires is terminated at one end to the four contacts of the stator 112 and at the other end to the terminals of the connector half 126. A third cable 146 having four wires is terminated at one end to the four contacts of the rotor 110, passes through an opening 148 in the second plate 90 and is terminated at the other end to terminals in a connector 150 which mates with circuitry on the substrate 32. In the present example the circuitry on the substrate 32 to which the connectors 142 and 150 mate is a multiplex circuit or line concentrator of the type which permits direct access to each of the terminals of the connector 142, in this case 64 terminals, through the four wire cable 146 by providing appropriate address information to the circuit. Any suitable multiplexing circuit or line concentrator that is well known in the industry may be used. A corresponding multiplexing circuit is provided on the substrate 34 to which the terminals of the connector 20 mate to provide 64 terminals at the machine 10 which addressably correspond to 64 terminals on the connector 28.

When changing reels 14, the frame 42 is lowered until the reel rests on the floor. This releases the load on the axle 40 so that it can be pulled out of engagement to the left, as viewed in FIGS. 1 and 2, and the drive pin 80 withdrawn. The reel 14 is then replaced with a reel having the desired type of cable, the axle 40 and drive pin 80 reinserted, and the connector half 26 of the pigtail 22 mated with the connector half 28. The reel 14 is then raised off the floor so that it can rotate freely. A portion of the cable 12 is then pulled off the reel 14, the jacket is stripped back from the end, and the end is clamped in the machine 10 preparatory to terminating the wires 16 into the connector half 18.

An important advantage of the present invention is the capability to electrically couple the wires of the cable to circuitry contained within the terminating machine for identification and testing purposes while the reel remains on the axle and free to turn. Thus, as cable assemblies are finished, additional cable may be easily drawn off the reel and production resumed without disturbing the electrical coupling.

Another important advantage is the capability to easily and quickly exchange reels having different types of cable to meet various production requirements.

We claim:

1. In a machine for automatically identifying and terminating wires of a multi-wire cable to corresponding terminals of a connector, said machine including: (1) a length of multi-wire cable wound about a reel, arranged for rotation with respect to said machine, said cable having a first end proximate the rotational axis of said reel and a second end extending from the periphery of said reel; (2) a frame having an axle for receiving any one of a plurality of different cable reels for rotation thereon; (3) apparatus for accepting said second end and applying a signal to a selected wire of said cable; (4) control means for monitoring a plurality of electrodes, which are non-rotationally coupled to said machine, identifying a specific one of said electrodes having said signal impressed thereon, and determining a desired terminal of said connector that corresponds to said selected wire; the improvement comprising:

means for releasably connecting the wires of said first end of said cable with corresponding ones of said plurality of electrodes while permitting rotation of said reel comprising:
(a) a first connector having terminals which are terminated to the wires of said first end of said cable; and
(b) rotational coupling means attached to said frame for electrically coupling said terminals of said first connector with corresponding electrodes of said plurality of electrodes.

2. The machine according to claim 1 wherein, said coupling means includes a rotor and a stator and a plurality of contacts on said rotor electrically connected with corresponding contacts on said stator, said stator being attached to said frame and said rotor arranged to rotate about said axis in concert with said reel.

3. The machine according to claim 2 wherein said coupling means includes a second connector means for releasably connecting the terminals of said first connector with said plurality of contacts on said rotor, and a third connector means for releasably connecting said plurality of contacts on said stator with corresponding ones of said plurality of electrodes.

4. The machine according to claim 2 wherein the number of said plurality of contacts on said rotor is fewer than the number of wires in said cable.

5. The machine according to claim 4 including multiplexing means for electrically coupling said terminals of said first connector with said corresponding electrodes through said fewer number of contacts on said rotor.

6. The machine according to claim 1 wherein said rotational coupling means comprises:
(1) a base plate which is rigidly attached to said machine;
(2) a drive axle journaled for rotation in said base plate;
(3) first and second rotating plates, spaced apart and attached to an end of said drive axle for rotation therewith;
(4) slip ring means having a rotor attached to one of said first and second plates for rotation therewith about the rotational axis of said drive axle, and having a stator attached to said base plate, said rotor and stator having a plurality of electrical contacts.

7. The machine according to claim 6 wherein said rotational coupling means includes:
(1) a substrate having a multiplexing circuit thereon disposed between said first and second plates and arranged for rotation therewith;
(2) a first cable having one end terminated in a connector half mated with said first connector and the other end routed through an axial bore in said drive axle, into the area between said first and second rotating plates, and into engaging contact with said multiplexing circuitry;
(3) a second cable having one end terminated to said plurality of contacts of said stator and the other end in engaging contact with said plurality of contacts of said rotor.

8. The machine according to claim 1 wherein said rotational coupling means includes means for exchanging cable reels comprising:
(1) a base rigidly attached to said machine;
(2) a drive axle journaled for rotation with respect to said base plate;
(3) a drive dog plate attached to said drive axle for rotation therewith;
(4) a drive pin associated with said drive dog plate for rotationally coupling said drive axle to said reel.

9. The machine according to claim 8 wherein said drive axle includes an axial bore for loosely receiving an end of said axle and said drive pin is selectively positionable with respect to said drive dog plate from a first position where said pin projects into an opening in said reel to a second position where said pin is clear of said opening.

* * * * *